US007158067B2

(12) United States Patent
Lauritzen et al.

(10) Patent No.: US 7,158,067 B2
(45) Date of Patent: Jan. 2, 2007

(54) ANALOG TO DIGITAL CONVERTER USING SAWTOOTH VOLTAGE SIGNALS WITH DIFFERENTIAL COMPARATOR

(75) Inventors: Keir C. Lauritzen, Odenton, MD (US); Martin Peckerar, Silver Spring, MD (US); F. Keith Perkins, Alexandria, VA (US); Angela M. Hodge-Miller, White Plains, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/053,756

(22) Filed: Jan. 31, 2005

(65) Prior Publication Data

US 2006/0170580 A1 Aug. 3, 2006

(51) Int. Cl.
H03M 1/12 (2006.01)
H03M 1/00 (2006.01)
H03K 4/06 (2006.01)

(52) U.S. Cl. ............... 341/155; 341/136; 327/131

(58) Field of Classification Search ........... 341/118, 341/120, 144, 155, 156, 158, 159, 170, 136, 341/166; 327/108, 132, 184, 540, 131; 332/109; 713/500
See application file for complete search history.

(56) References Cited

U.S. PATENT DOCUMENTS

| | | | | |
|---|---|---|---|---|
| 3,390,354 A | * | 6/1968 | Munch | 332/109 |
| 3,886,541 A | * | 5/1975 | Watson et al. | 341/170 |
| 4,216,387 A | * | 8/1980 | Reed | 327/132 |
| 4,283,713 A | * | 8/1981 | Philipp | 341/142 |
| 4,297,679 A | | 10/1981 | Arbel et al. | 341/156 |
| 4,598,270 A | * | 7/1986 | Shutt et al. | 341/166 |
| 5,113,188 A | * | 5/1992 | Kuo et al. | 341/133 |
| 5,200,648 A | * | 4/1993 | Vyas | 327/184 |
| 5,227,671 A | * | 7/1993 | Ehrlich | 327/108 |
| 5,324,995 A | | 6/1994 | Yee | 327/91 |
| 5,367,202 A | | 11/1994 | Yee | 327/540 |
| 5,376,937 A | | 12/1994 | Yee | 341/159 |
| 5,392,045 A | | 2/1995 | Yee | 341/156 |
| 5,416,484 A | * | 5/1995 | Lofstrom | 341/159 |
| 5,471,210 A | | 11/1995 | Wingender et al. | 341/156 |
| 5,563,598 A | * | 10/1996 | Hickling | 341/155 |
| 5,706,008 A | | 1/1998 | Huntley, Jr. et al. | 341/156 |
| 6,121,912 A | * | 9/2000 | Brandt | 341/156 |
| 6,255,979 B1 | * | 7/2001 | Allee et al. | 341/159 |
| 6,389,548 B1 | * | 5/2002 | Bowles | 713/500 |

(Continued)

OTHER PUBLICATIONS

Sedra, A. and Smith, K., Microelectronic Circuits (4th Edition). Oxford University Press, New York, 1998, pp. 854-870, no month.

(Continued)

Primary Examiner—Patrick Wamsley
(74) Attorney, Agent, or Firm—John J. Karasek; Sally A. Ferrett

(57) ABSTRACT

An analog to digital converter includes a resistor-divider network including a plurality of resistors, an arbel channel circuit configured to generate a voltage sawtooth signal as an output, a dc-offset disposed to couple a node of the resistor-divider network and the arbel-channel circuit. The converter further includes a voltage reference circuit configured to generate a reference voltage, and a differential comparator configured to compare the voltage sawtooth signal with the reference voltage to produce a digital output signal corresponding to the voltage sawtooth signal. Method of converting an analog signal to a digital signal is also described.

29 Claims, 10 Drawing Sheets

U.S. PATENT DOCUMENTS

| | | | |
|---|---|---|---|
| 6,459,400 B1 | 10/2002 | Steinbach | 341/156 |
| 6,504,499 B1 * | 1/2003 | Masenas et al. | 341/155 |
| 6,518,898 B1 * | 2/2003 | Choksi | 341/118 |
| 6,664,910 B1 | 12/2003 | Mulder et al. | 341/158 |
| 6,686,862 B1 * | 2/2004 | Tagare | 341/155 |
| 6,762,708 B1 | 7/2004 | Sutardja | 341/155 |
| 2004/0085236 A1 | 5/2004 | Yoon | |

OTHER PUBLICATIONS

Arbel, A. and Kurz, R., "Fast ADC", IEEE Transactions on Nuclear Science, vol. NS-22, Feb. 1975, pp. 446-451, no date.

Arbel, A., Analog Signal Processing and Instrumentation, Cambridge University Press, 1980, pp. 218-246, no month.

* cited by examiner

ANALOG TO DIGITAL CONVERTER USING SAWTOOTH VOLTAGE SIGNALS WITH DIFFERENTIAL COMPARATOR

TECHNICAL FIELD

Aspects of the invention generally relate to analog-to-digital converter apparatuses and methods for converting analog signals to digital signals. More specifically, aspects of the invention relate to CMOS A/D converter apparatuses with Arbel channel and methods.

BACKGROUND OF THE INVENTION

In many high-performance applications, two exemplary competing design parameters of A/D converters are speed and resolution. Many designs for A/D converters have been proposed which include deterministic A/D converters and sequential A/D converters. Each of the proposed designs has its own merits and disadvantages. Deterministic A/D converters receive an analog input and produce an output after a delay. Sequential A/D converters use feedback, RC charging, or other such methods and require several internal steps to generate the digital output. Further details regarding deterministic and sequential A/D converters can be found in Sedra and Smith, Microelectronic Circuits (4$^{th}$ Edition), Oxford University Press, pages 864–870, the details of which are incorporated herein by reference in their entirety.

Sequential A/D converters can generate high precision conversions and can allow for high resolutions. Examples of such topologies include feedback-type, delta-sigma type, dual-slope and charge redistribution. Such topologies generally trade speed for precision.

Deterministic A/D converters are generally high speed devices, and lack the precision of the sequential devices. For example, the highest deterministic A/D resolutions are generally found to be of 8-bits. Such A/D converters are considered deterministic since other than for control of track/hold functionality, there is no control logic, clocking, or iterative, series comparisons. Such A/D converters simply produce the digital output from the received input. Two principal topologies of these devices are, for example, folding and flash type designs. Both are high speed implementations and are further discussed below.

Accordingly, there is a need to overcome the above-identified problems.

SUMMARY OF THE INVENTION

In one aspect, an analog to digital converter includes a resistor-divider network including a plurality of resistors, an Arbel channel circuit configured to generate a voltage sawtooth signal as an output, a dc-offset disposed to couple a node of the resistor-divider network and the Arbel-channel circuit. The converter further includes a voltage reference circuit configured to generate a reference voltage, and a differential comparator configured to compare the voltage sawtooth signal with the reference voltage to produce a digital output signal corresponding to the voltage sawtooth signal.

In another aspect, an apparatus for converting an analog signal to a digital signal includes a resistor-divider network, an Arbel channel circuit configured to generate a voltage sawtooth signal as an output, the Arbel channel circuit including $2^{N-n}$ Arbel cells for each bit of the Arbel channel, wherein N is the total number of bits and n is the current bit and each of the Arbel cells include at least first, second, and third sections. The apparatus further includes a DC offset circuit disposed to couple a node of the resistor-divider network and the Arbel-channel circuit, a voltage reference circuit configured to generate a reference voltage, and a differential comparator configured to compare the voltage sawtooth signal with the reference voltage to produce a digital output signal corresponding to the voltage sawtooth signal.

In yet another aspect, a method of converting an analog signal to a digital signal includes generating a voltage sawtooth signal using an Arbel channel circuit, generating a reference voltage, and comparing the voltage sawtooth signal with the reference voltage to produce a digital output signal corresponding to the voltage sawtooth signal.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
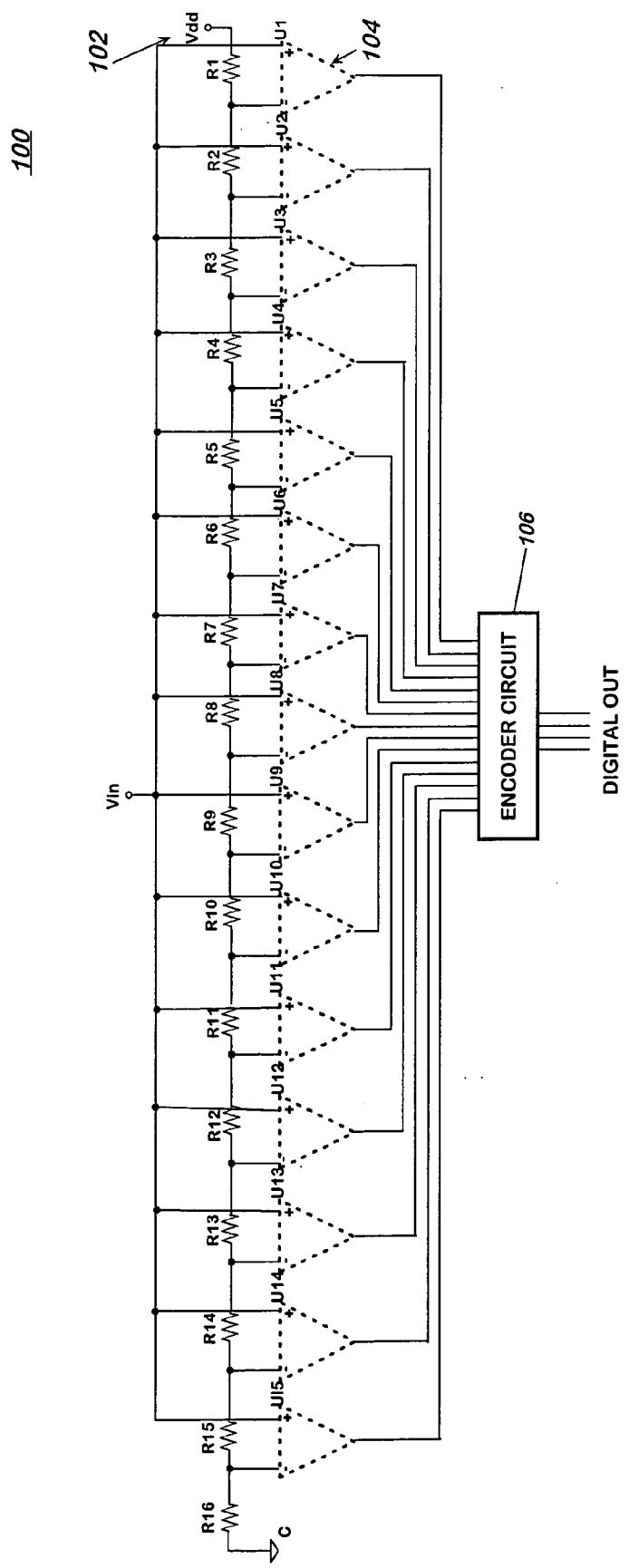
FIG. 1 is a schematic of a flash A/D converter.

FIG. 1 shows a schematic of a flash A/D converter 100. The A/D converter 100 includes a resistive ladder 102, a plurality of comparators 104, and an encoder 106. Flash A/D conversion using the circuit as shown in FIG. 1 uses $2^N-1$ comparators 104 and a $2^N-1$ to N encoder 106 to generate a digital output of N bits. Parallel flash conversion is a common design which includes $2^N$ resistors and the differential comparators and encoder, such as, for example, comparators 104 and encoder 106. In such parallel flash conversion, the resistors (e.g., resistors 102) are configured in a series chain and divide a precision reference voltage into a set of regularly spaced voltages which are in turn connected to one of the inputs of the differential comparators (e.g., comparators 104). The input voltage to be converted to a digital signal is connected to the other $2^N-1$ comparator inputs of the comparators 104. The differential comparators 104 compare the two inputs and produce a logic 0 or 1 based on which is larger as a result of the comparison. The output of this comparator ladder (e.g., output of the plurality of comparators 104) is a series of 0's followed by 1's, called a thermometer code. The thermometer code is then connected to the encoder 106 which converts the code to binary format.

Figure 2:
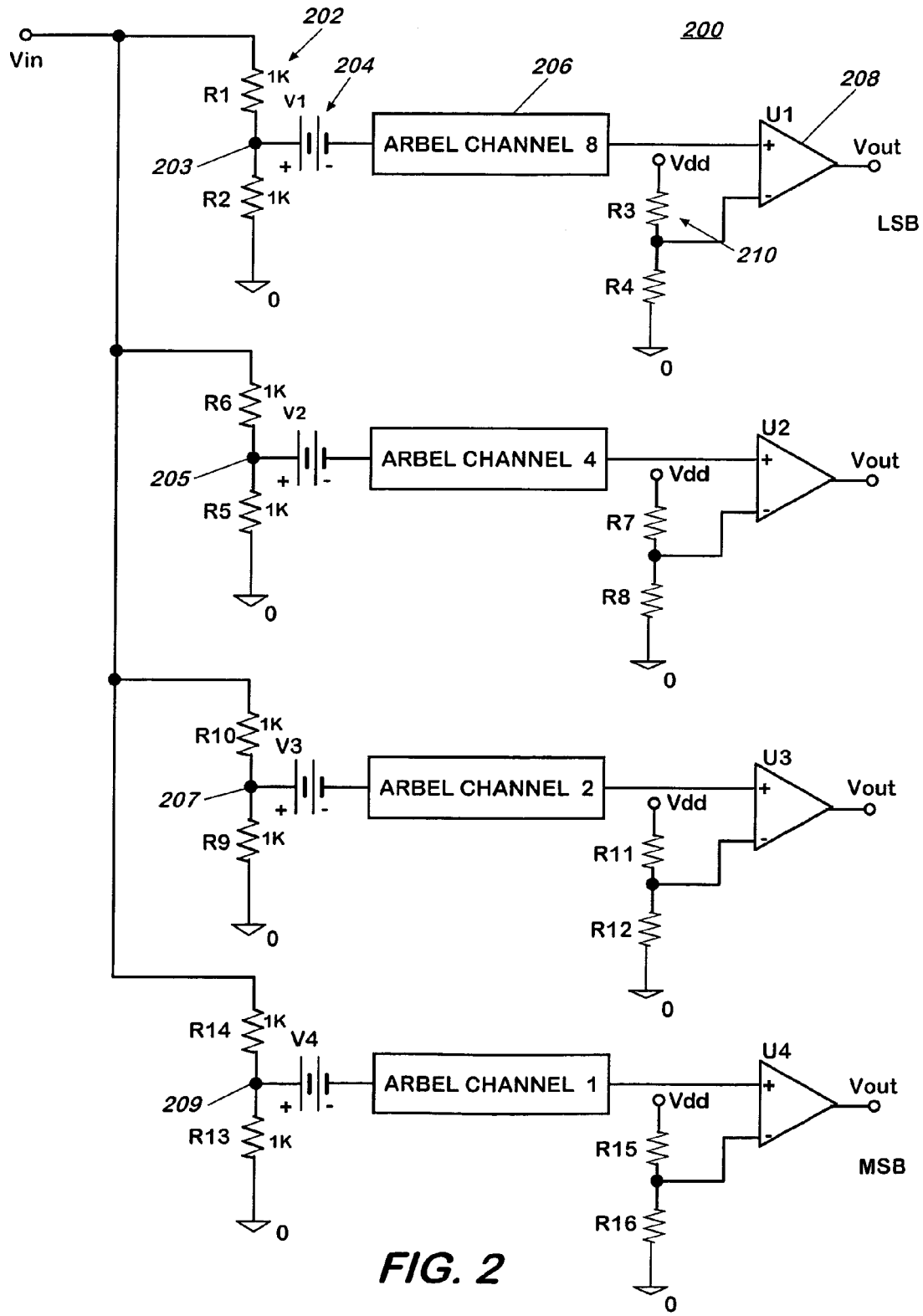
FIG. 2 is a block diagram schematic of an exemplary 4-bit analog-to-digital (A/D) converter in accordance with an embodiment of the invention.

FIG. 2 is a block diagram schematic of an exemplary 4-bit analog-to-digital (A/D) converter 200 in accordance with an embodiment of the invention. The A/D converter 200 includes a resistor-divider network 202, a plurality of DC offset circuits 204, a plurality of Arbel channels 206, a plurality of comparators 208, and a plurality of voltage reference networks 210. The resistor-divider network 202 is configured to divide the input voltage into regularly spaced voltages at nodes 203, 205, 207, and 209, respectively, the respective nodes being connected to one end of the respective ones of the DC offset circuits 204. The other end of the respective DC offset circuits 204 is connected to a corresponding Arbel channel 206 and the output of such Arbel channel 206 is connected to a non-inverting input of the corresponding comparator 208. The inverting input of the comparators 208 is connected to a corresponding voltage reference network 210. The 4-bit A/D converter as shown in FIG. 2 is for purposes of illustration. The A/D converter 200 includes a self-encoding design using a reduced number of differential comparators. The illustrated 4-bit A/D converter 200 includes four DC offset circuits 204, Arbel channels 1, 2, 4, and 8, and four comparators 208. It will be appreciated that A/D converters of other resolutions are possible.

Figure 3:
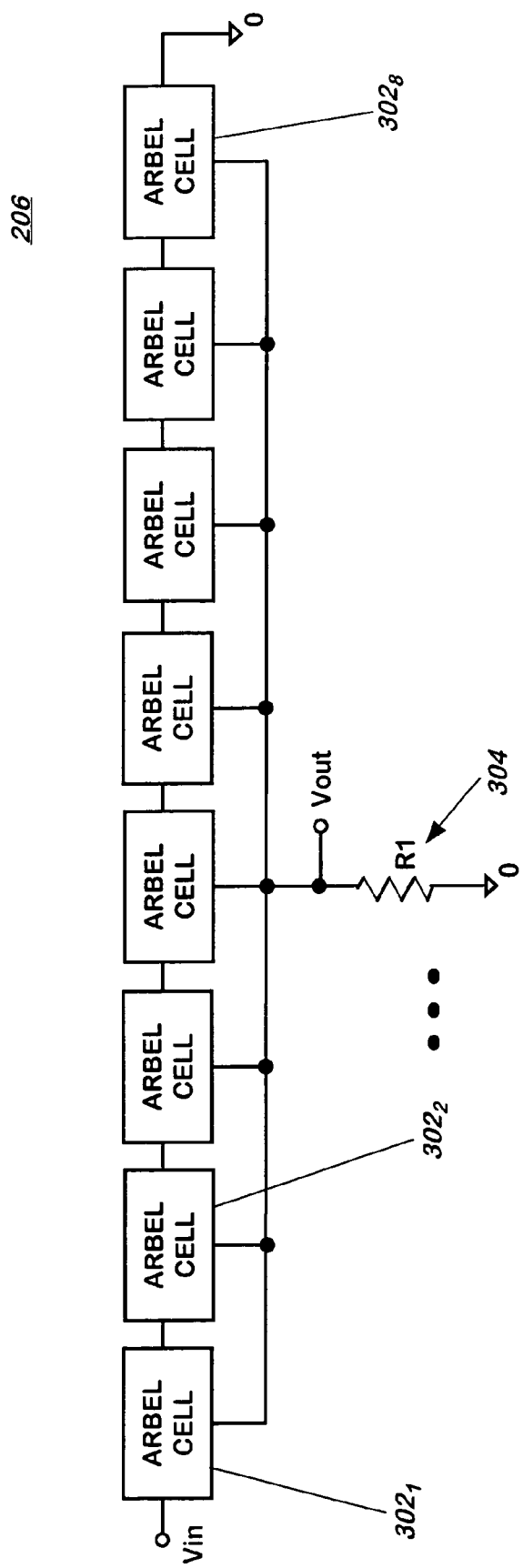
FIG. 3 is an exemplary schematic of the Arbel channel shown in FIG. 2.

FIG. 3 is an exemplary schematic of the Arbel channel 206 shown in FIG. 2. The Arbel channel 206 includes a plurality of Arbel cells $302_1-302_8$. The schematic of the Arbel channel 206 shown in FIG. 3 is an exemplary schematic of the Arbel channel configured with respect to the Least Significant Bit (LSB) of the A/D converter 200 (FIG. 2). It will be appreciated that the number of cells present in the Arbel channel may be higher or lower depending on the bit resolution with which the Arbel channel is associated with. For example, in the exemplary 4-bit A/D converter 200 (FIG. 2), Arbel channel 206 associated with the LSB is shown to have eight Arbel cells, and the Arbel channel 206 associated with the MSB can have one Arbel cell, and so on and so forth.

The Arbel channel 206 includes stacked cells (e.g., Arbel cells $302_1-302_8$) the outputs of which are connected to resistor 304 (e.g., load resistor). The resistor 304 can be connected to the comparator (e.g., differential comparator) 208 (FIG. 2). In the embodiment shown in FIG. 3, the resistor 304 is designed for a single rail power supply. Other designs are possible. Although the comparator 208 (FIG. 2) can be designed in several ways, each of such designs is preferred to work in the hundreds of millivolts range. For each bit of the Arbel channel 206, $2^{N-n}$ cells may be necessary, where "N" is the total number of bits and "n" is the current bit. In the exemplary embodiment shown in FIG. 2, the LSB of the 4-bit converter requires 8 Arbel cells.

Figure 4:
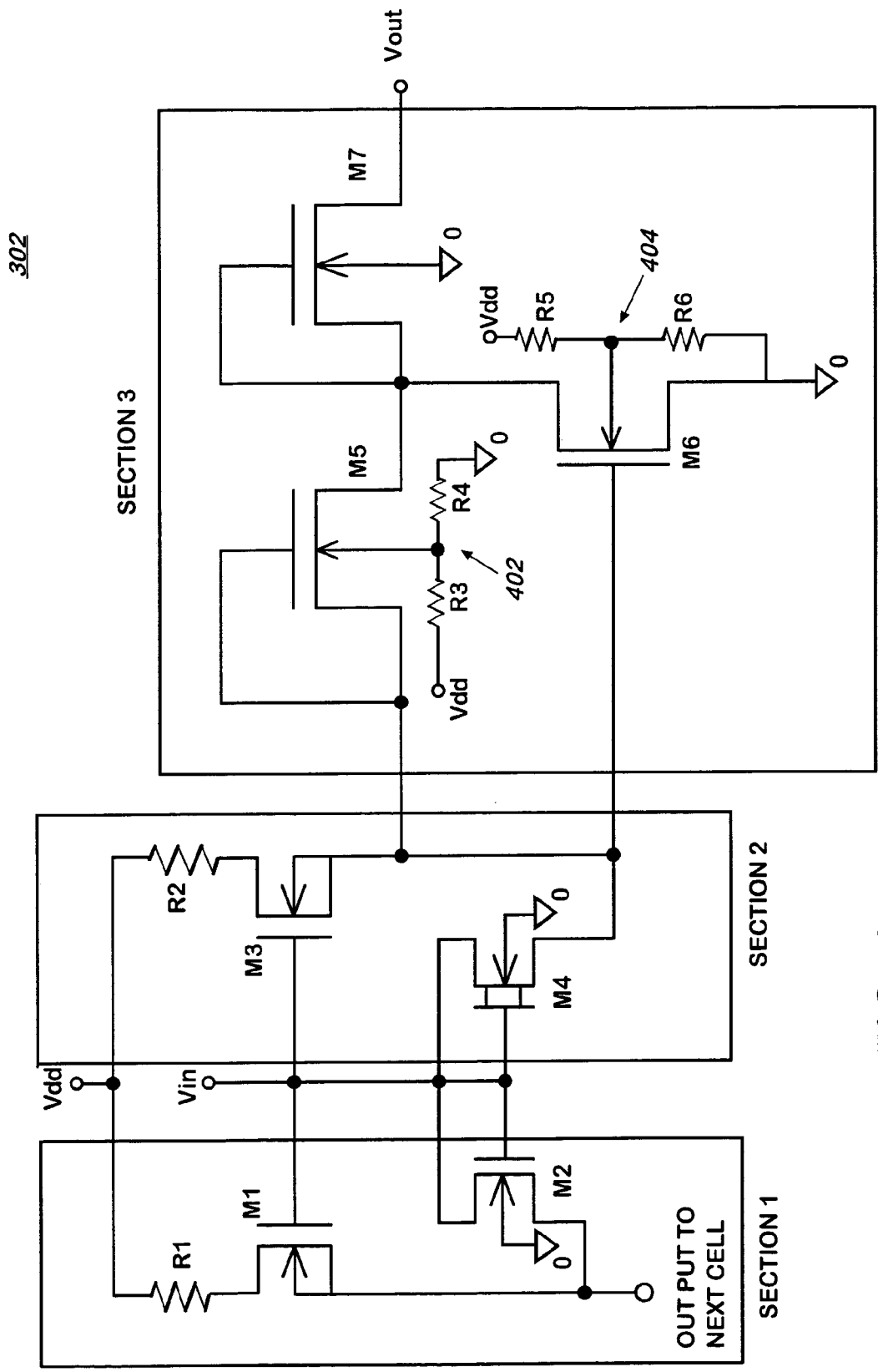
FIG. 4 is circuit schematic of an Arbel cell shown in FIG. 3.

FIG. 4 is circuit schematic of an Arbel cell 302 shown in FIG. 3. The Arbel cell 302 includes three sections (e.g., section 1, section 2, and section 3) as illustrated in FIG. 4. For example, transistors M1, M2, and resistor R1 make up section 1 (e.g., voltage dropping section). Transistor M1 and the resistor R1 form a common-drain amplifier which acts to create a voltage drop. M2 is a shunt transistor and is configured to ensure that the created voltage drop stays constant. Such creates a standard voltage drop that is then connected to the input of the next Arbel cell. The resistor R1 can be used as a biasing current source. The shunt transistor M2 is preferred to be "slow" having a low constant $K_p$ in order to minimize the current drawn from the input and to maintain high input impedance.

Section 2 as illustrated in FIG. 4 includes resistor R2, transistors M3 and M4. Section 2 makes up the buffer to Section 3 (e.g., a sawtooth generating section). Transistor M3 and resistor R2 are configured as a common-drain amplifier and provide the current to the rest of the circuit of the Arbel cell 302. Transistor M4 can be configured as a depletion-mode shunt transistor. It is preferred that the turn-on voltage of the transistor M4 is close to, or slightly less than, zero. In one embodiment, the transistor M4 is made "slow" in order to retain a desired high impedance. In one embodiment, the buffering transistor M3 is preferred to be kept small in order to minimize power consumption.

Section 3 of the Arbel cell 302 is configured to generate the voltage sawtooth and includes transistors M5, M6, M7, and resistors R3, R4, R5, and R6. The source nodes of the buffer-diode pair of transistors M3 and M4 connect to the pull-up transistor M5 and to the gate of the pull-down transistor M6. The source of the pull-up transistor M5 connects to the drain of the pull-down transistor M6. Connected to the body of the pull-up and pull-down transistors M5 and M6, respectively, are resistive divider networks 402 and 404 which can control where the peak of the sawtooth occurs as well as for fine tuning of the A/D converter 200 (FIG. 2). Also connected to the source of the pull-up transistor M5 is the drain of the transistor M7 (e.g., sloshback diode). The source of the transistor M7 is the output $V_{out}$ of the Arbel cell 302. The transistor M7 serves as a "valve" to isolate the functionality of the Arbel cell 302 from the load resistor 304 (FIG. 3).

Figure 4A:
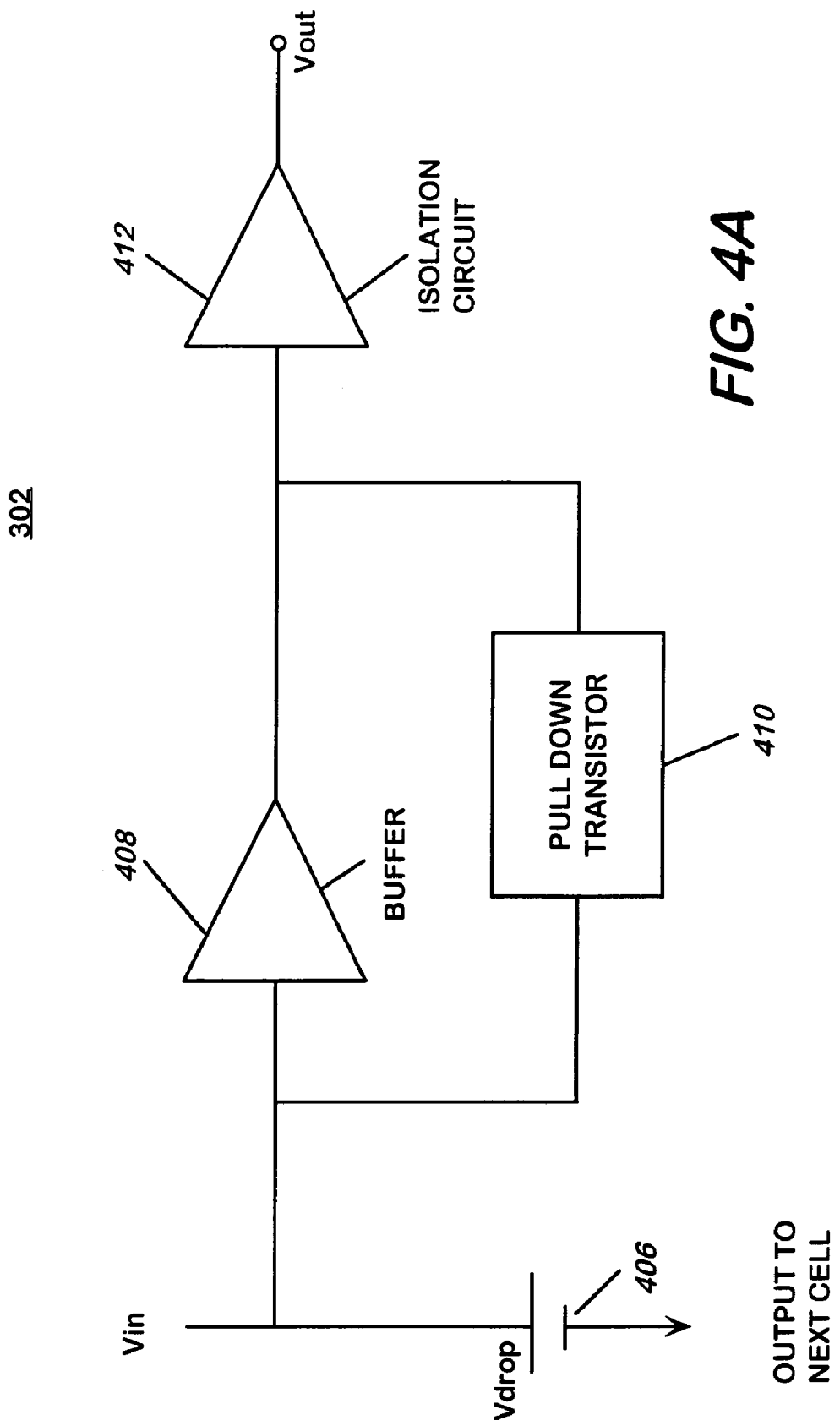
FIG. 4A is a high level schematic of the Arbel cell shown in FIGS. 3 and 4.

FIG. 4A is a high level schematic of the Arbel cell 302 shown in FIGS. 3 and 4. The Arbel cell 302 includes a dc voltage source 406 for generating a voltage drop, a buffer 408 which corresponds to section 2 shown in FIG. 4, a pull down transistor 410 which corresponds to the pull down transistor M6 shown in FIG. 4, and an isolation circuit 412. The operation of the circuit 302 as shown in FIG. 4A is similar to what has been described with respect to FIG. 4 and is therefore not repeated.

Figure 5:
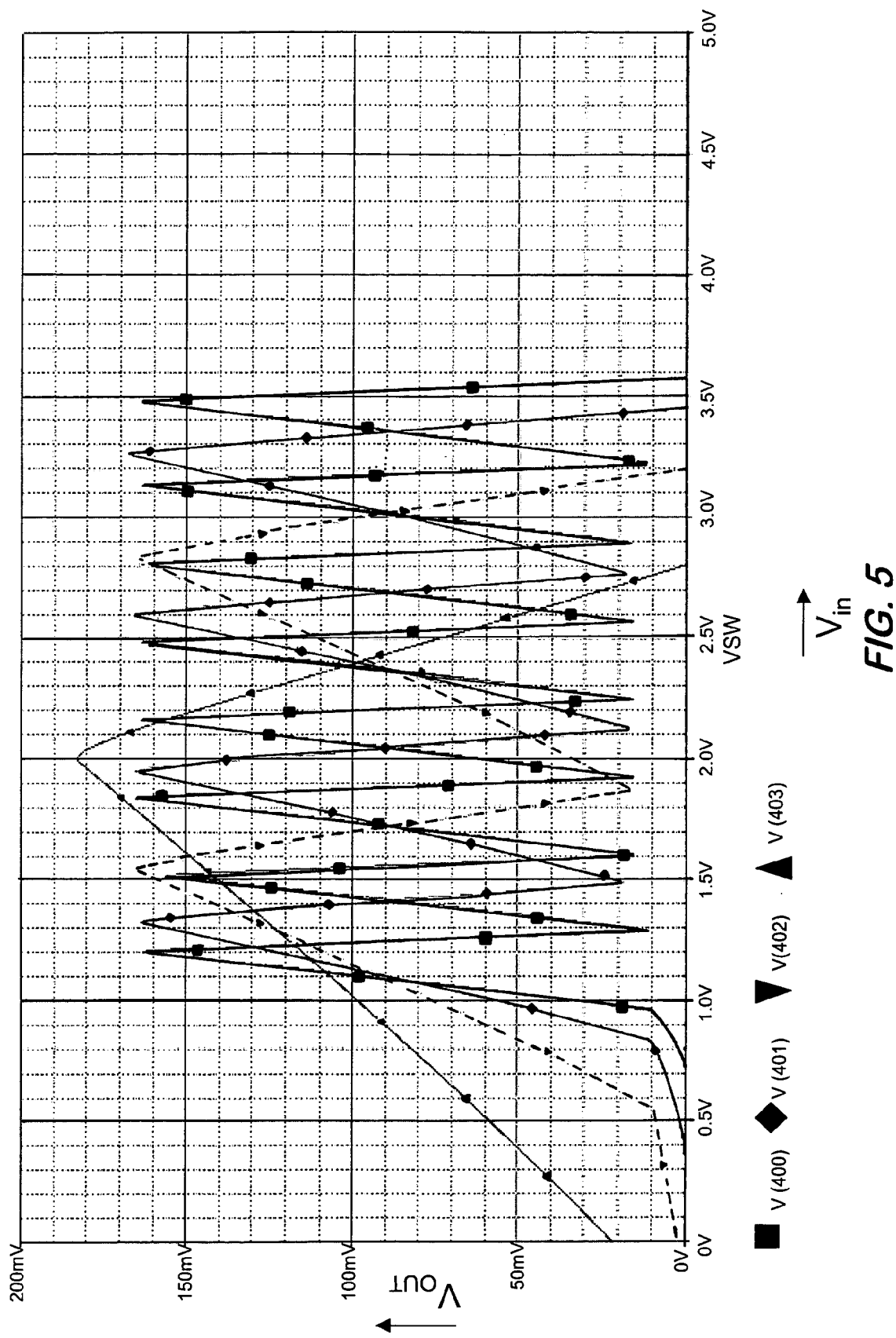
FIG. 5 is the sawtooth output of each of the four Arbel channels, each Arbel channel having 1, 2, 4, and 8 cells.

FIG. 5 is the sawtooth output of each of the four channels (e.g., Arbel channel 206) with 1, 2, 4, and 8 cells of the Arbel channel 206. The sawtooth signal, when fed into the comparator logic (e.g., comparator 208), is used to generate the binary information. In one embodiment, the voltage sawtooth signal is generated using an all-CMOS process. Such is done primarily by using the pull-down transistor M6 (FIG. 4). In one embodiment, the transistor M6 can be a "large" transistor having a high constant Kp or width. For example, the "large" transistor can be defined as a transistor wherein for a given gate bias, the drain current will be high. In such an embodiment, the transistor M6 can have a higher threshold voltage relative to other transistors of the Arbel cell 302 shown in FIG. 4. During operation, when the transistor M6 turns on, it tries to drain a large amount of current. Since it would be difficult for the transistor M6 to drain a large amount of current, it pulls down the output voltage $V_{out}$.

The exemplary design of the 4-bit A/D converter as shown in FIG. 2 includes transistors and resistors. The majority of the resistors can be biasing resistors to trim and align the circuit. In each Arbel cell, three resistor pairs are provided that can be used to tune the A/D converter 200

(FIG. 2). The divider network 202 (FIG. 2) at the input changes the spacing of the peaks. The Arbel cell body biases can be used to tune each individual transition (e.g., R3, R4, R5, and R6 of FIG. 4). The reference voltage at the comparator (e.g., comparator 208) changes the duty cycle and allows even spacing of the transitions. The inventors have found that the number of transistors required for the exemplary A/D converter using the Arbel cell shown in FIG. 4 is much smaller than comparable flash converters.

Figure 6:
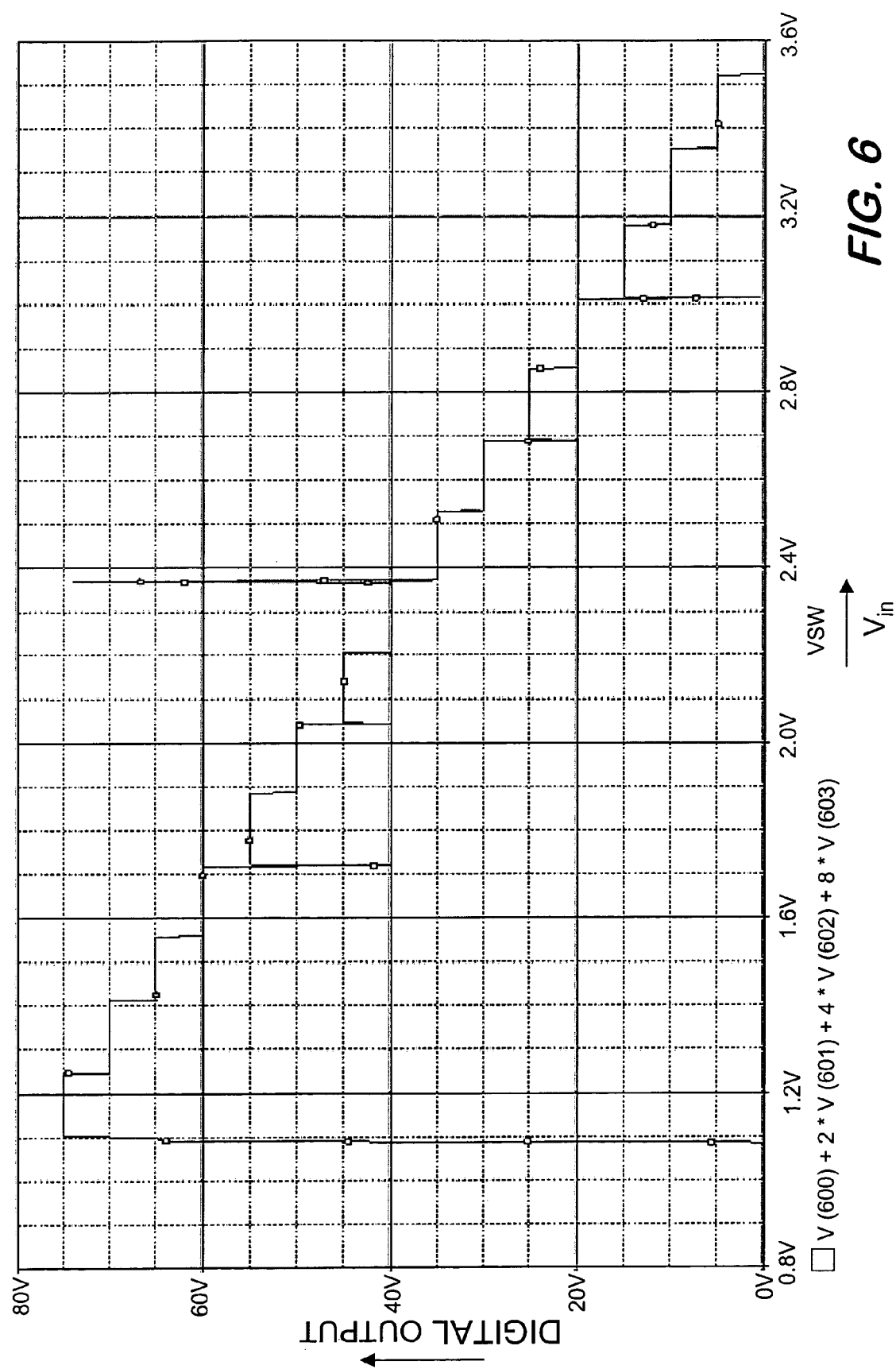
FIG. 6 shows the input-output characteristic (e.g., voltage transfer characteristic) of the A/D converter shown in FIG. 2, the input-output characteristic being measured using PSPICE simulation.
Figure 7:
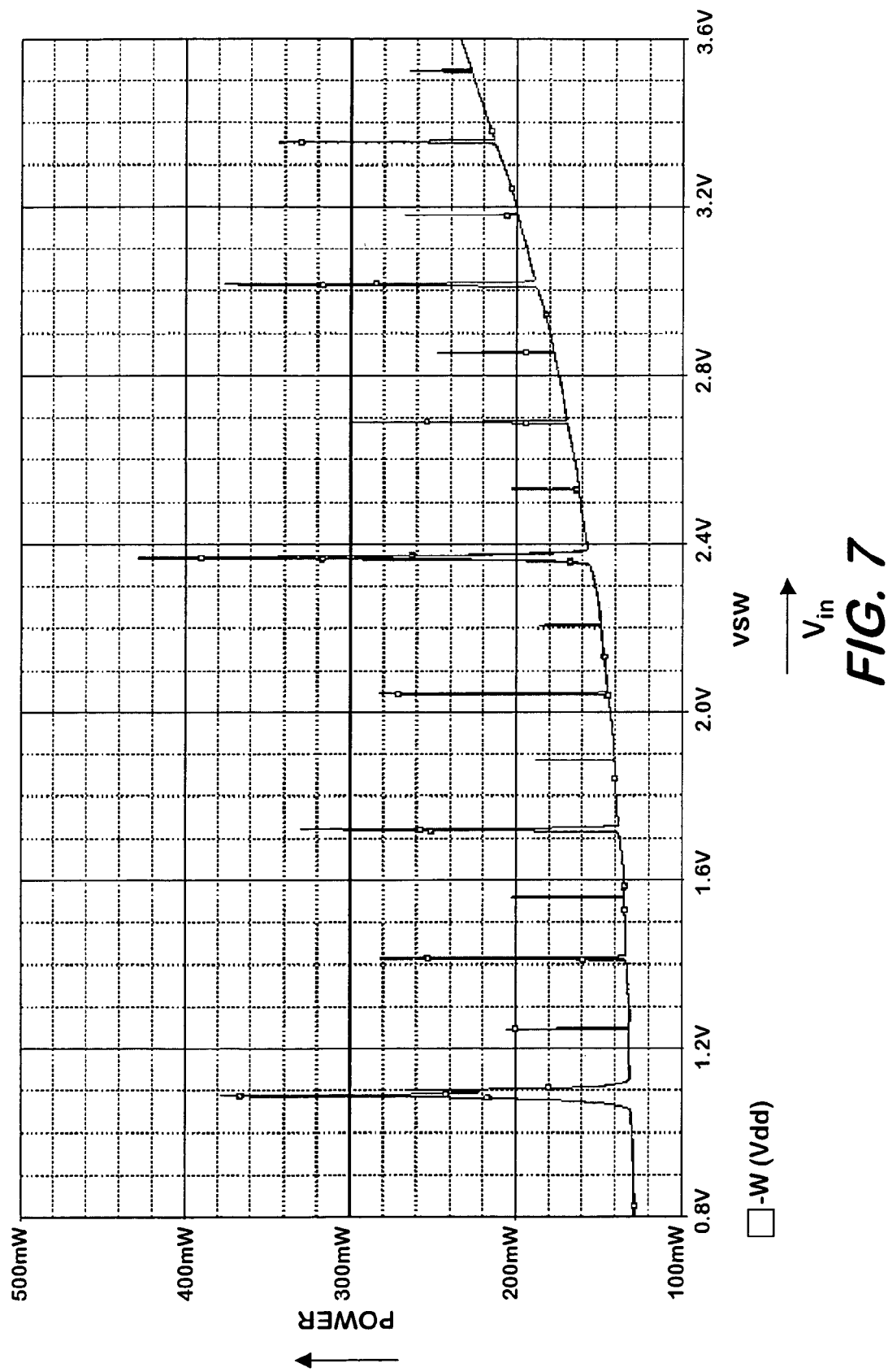
FIG. 7 is a graph of the static power consumption of the A/D converter shown in FIG. 2, the static power consumption was found to be on average less than 200 mV.

FIG. 6 shows the input-output characteristic (e.g., voltage transfer characteristic) of the resulting A/D converter 200 (FIG. 2) as measured from a PSPICE simulation. The horizontal axis is shown to represent the input voltage and the curve shown represents the digital output of the A/D converter 200. The curve shows that the output of the A/D converter 200 is highly linear. The inventors have measured the static power consumption of the A/D converter 200 in the same simulation. Such static power consumption was found to be on average less than 200 mV as shown in FIG. 7.

Figure 8:
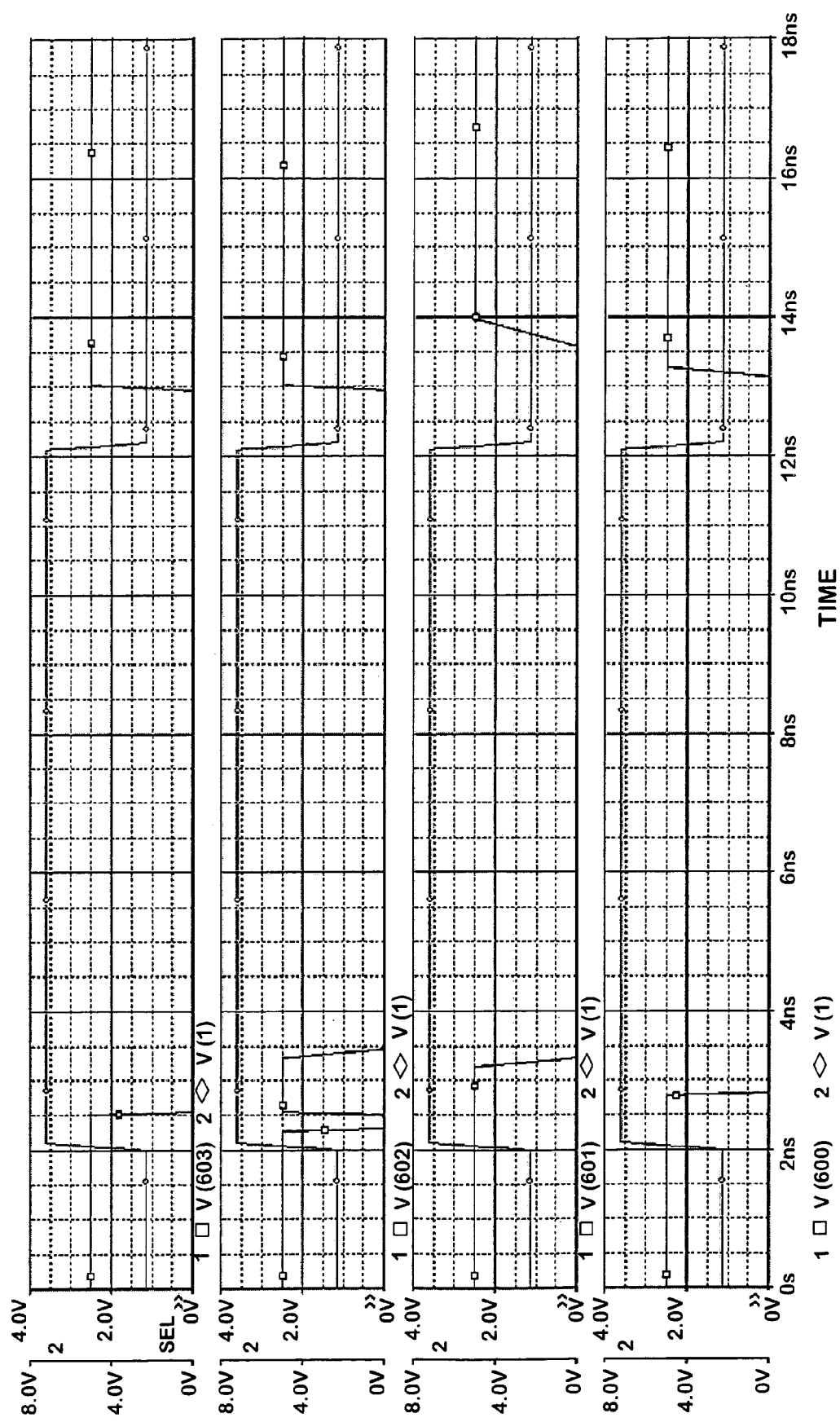
FIG. 8 shows the pulse response of the A/D converter shown in FIG. 2 and tested in PSPICE with the application of a signal with a low level just below threshold for generating a "0000" output, a high level just above threshold for generating a "1111" output, and a one nanosecond rise and fall time.
Figure 9:
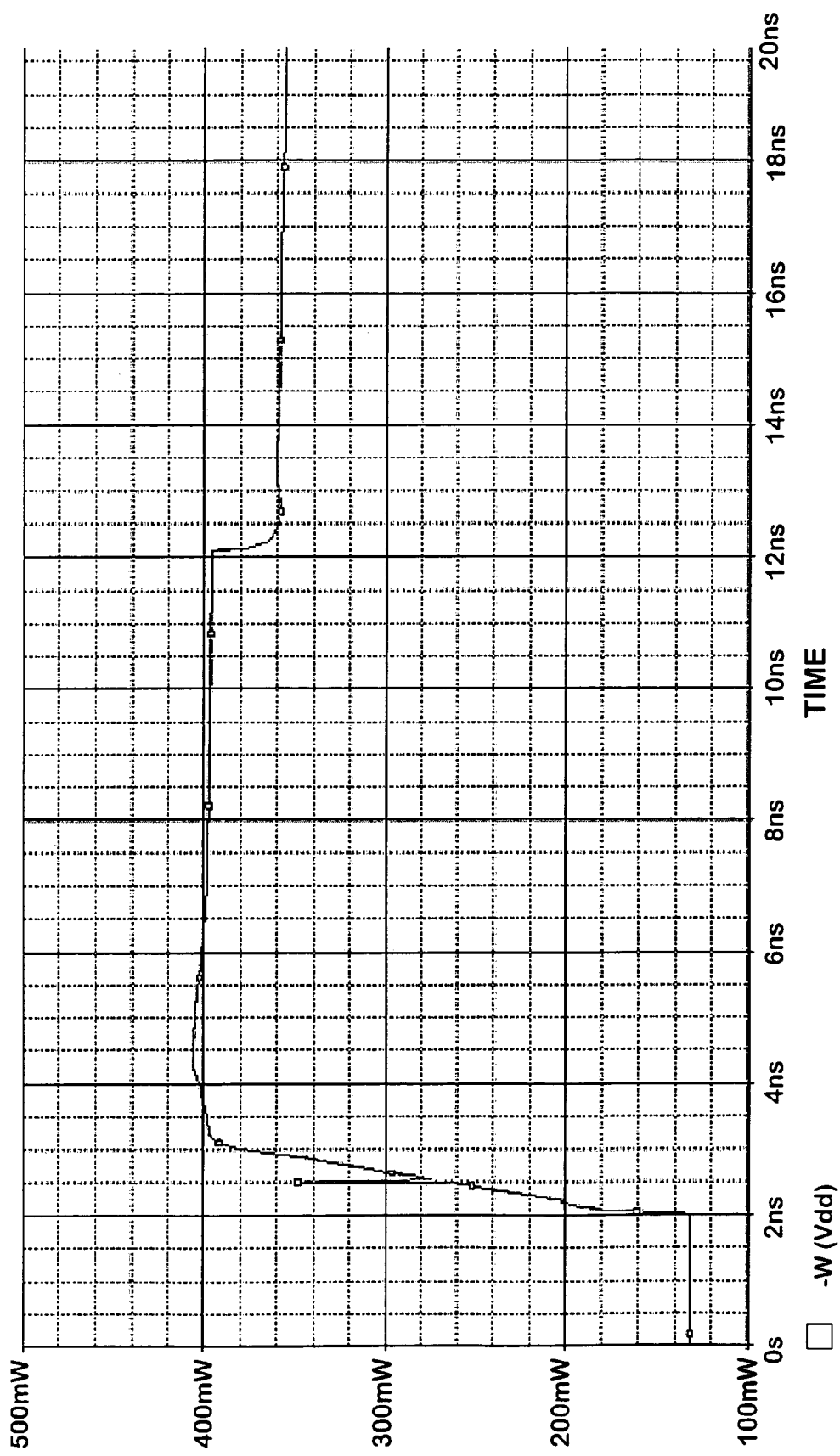
FIG. 9 is a graph showing the dynamic power of the A/D converter shown in FIG. 2.

The pulse response of the A/D converter 200 was tested in PSPICE with the application of a signal with a low level just below a threshold level for generating a "0000" output, a high level just above the threshold for generating a "1111" output, and a one nanosecond rise and fall time. Such results are shown in FIG. 8. The inventors have found that the response time is less than 2 ns, implying a sampling rate of 500 million samples per second (MS/s). Each bit of the output of the A/D converter 200 is generated individually, eliminating the need for complex encoder logic circuitry. The overall speed of the A/D converter 200 is determined by the speed of the Arbel channels (e.g., Arbel channel 206), and in particular the LSB channel. The dynamic power of the A/D converter 200 is shown in FIG. 9.

Aspects of the invention provide various advantages, which in some embodiments include elimination of the resistive ladder, reduction in the number of comparators, and elimination of the encoder logic without sacrificing performance, when compared to conventional high speed, low resolution A/D converters. The circuit design according to various embodiments of the present invention reduces the die size of the A/D converter, thereby enhancing possibilities for integration as well as manufacturing economics. Other advantages include minimizing the number of comparators to N for an N-bit converter thereby minimizing power consumption and allowing BiCMOS or bipolar comparators to be used with less of an impact on power consumption or total die size. Such reduction also results in greater manufacturing yield, since with fewer devices, the total probability of error is reduced.

Further, various embodiments of the invention use N discrete channels to convert to N bits thereby eliminating the need for an encoder circuit used in prior designs. Such circuit design without an encoder circuit can also be applied to other architectures such as, for example, flash converters. The design in accordance with various embodiments generates a distinct transition required for each bit through the generation of multiple sawtooths as shown in FIG. 5, and therefore requires no encoder. Although various biasing resistors have been used in accordance with various embodiments, similar output can be achieved without using many of the biasing resistors through careful adjustments to various circuit parameters.

The A/D conversion circuit in accordance with various embodiments employs a novel topology to significantly reduce the complexity and the total number of components relative to comparable devices. The design in accordance with various aspects has numerous advantages which will enable the development of small, more pervasive sensor applications. In addition, numerous other military and commercial applications are possible including, but not limited to, microwave systems, high-speed communication, radar and sonar. Commercial applications include video processing and medical imaging. The A/D converter in accordance with various aspects provides the following innovations: a) development of a high speed, low power A/D converter in all-CMOS technology; b) N-bit conversion using N comparators; c) a self-encoding design based on maximum folding; d) a flexible, scalable design based on modular components; e) a design capable of generating multiple cycles of voltage "sawtooths" from a single ramp; f) a novel method of performing folding functions; g) a cell design potentially capable of other functions both analog and digital; h) a deterministic A/D converter without use of a resistor ladder; and i) a low component count.

Appendix 1 discloses an exemplary PSPICE simulation of the exemplary 4-bit A/D converter shown in FIG. 2.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

APPENDIX 1

```
*****************************************************************
********************Cell Primitives*************************
*****************************************************************
****Generic Cell****
*Only differences between cells are the values of Rbias_*
*Not used in circuit
*Each of the widths and lengths shown below in the (not used section) is multiplied by
*a factor of 10 by ahm in used subckt sections.
.subckt cell 1 2 3 4 ;basic cell used as a template for all other cells
Mdrop 8 1 2 2 nmos L=.25u W=1u ;Current buffering part of diode drop side
Mshunt 1 1 2 0 shunt L=.25u W=.25u ;Shunting part of diode drop side
Mbuff 7 1 5 5 nmos L=.25u W=40u ;Current buffering part of response side
Mraise 1 1 5 0 shunt_dep L=.25u W=1u ;Shunting voltage regulating part of response side
Mpullup 5 5 6 9 nmos L=.25u W=1u ;Transistor that causes rise in circuit
Mpulldown 6 5 0 10 big L=.25u W=40u ;Big pulldown transistor
Mslosh 6 6 3 0 nmos L=.25u W=40u ;Sloshback prevention diode
```

APPENDIX 1-continued

```
Rlimit1 7 4 100
Rlimit2 8 4 100
*Rbias_pullup_top 4 9 10K
*Rbias_pullup_bottom 9 0 0
*Rbias_pulldown_top 4 10 10K
*Rbias_pulldown_bottom 10 0 0
.MODEL nmos nmos(LEVEL=3 Vto=.3 kp=350u gamma=.2 phi=.6 lambda=.005
cgso=3.e−15
+ cgdo=3e−15 cgbo=5e−15 CJ=927u MJ=366m )
.MODEL big nmos(LEVEL=3 Vto=.9 kp=350u gamma=.2 phi=.6 lambda=.005
cgso=3.e−15
+ cgdo=3e−15 cgbo=5e−15 CJ=927u MJ=366m )
.MODEL shunt nmos(LEVEL=3 Vto=.3 kp=1u gamma=.2 phi=.6 lambda=.005
cgso=3.e−15
+ cgdo=3e−15 cgbo=5e−15 CJ=927u MJ=366m )
.MODEL shunt_dep nmos(LEVEL=3 Vto=0 kp=1u gamma=.2 phi=.6 lambda=.005
cgso=3.e−15
+ cgdo=3e−15 cgbo=5e−15 CJ=927u MJ=366m )
.NODESET V(6)=.3083 V(7)=5 V(8)=5
.ends cell
****16********************
.subckt cell_16_1 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 350
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e−15
+ cgdo=3e−15 cgbo=5e−15 CJ=927u MJ=366m )
.MODEL fatty nmos(LEVEL=3 Vto=.9 kp=350u gamma=.2 phi=.6 lambda=.005
cgso=3.e−15
+ cgdo=3e−15 cgbo=5e−15 CJ=927u MJ=366m )
.MODEL shunt nmos(LEVEL=3 Vto=.3 kp=1u gamma=.2 phi=.6 lambda=.005
cgso=3.e−15
+ cgdo=3e−15 cgbo=5e−15 CJ=927u MJ=366m )
.MODEL shunt_dep nmos(LEVEL=3 Vto=0 kp=1u gamma=.2 phi=.6 lambda=.005
cgso=3.e−15
+ cgdo=3e−15 cgbo=5e−15 CJ=927u MJ=366m )
.NODESET V(6)=.3083 V(7)=5 V(8)=5
.ends cell_16_1
.subckt cell_16_2 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown10 0 .16
Rbias_pullup_top 4 9 20K
Rbias_pullup_bottom 9 0 80
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e−15
+ cgdo=3e−15 cgbo=5e−15 CJ=927u MJ=366m )
.MODEL fatty nmos(LEVEL=3 Vto=.9 kp=350u gamma=.2 phi=.6 lambda=.005
cgso=3.e−15
+ cgdo=3e−15 cgbo=5e−15 CJ=927u MJ=366m )
.MODEL shunt nmos(LEVEL=3 Vto=.3 kp=1u gamma=.2 phi=.6 lambda=.005
cgso=3.e−15
```

APPENDIX 1-continued

```
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_2
.subckt cell_16_3 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 300
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_3
.subckt cell_16_4 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_4
.subckt cell_16_5 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
```

APPENDIX 1-continued

```
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_5
.subckt cell_16_6 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_6
.subckt cell_16_7 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
```

APPENDIX 1-continued

```
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_7
.subckt cell_16_8 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_16_8
*Generic 8 transition cell
*Not used in circuit
.subckt cell_8 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
Vbias_pullup 9 0 0
Vbias_pulldown 10 0 0
Rstart_1 2 0 10Meg
Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_8
****8 Transition cells Used****
.subckt cell_8_1 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
```

APPENDIX 1-continued

```
Rlimit1 7 4 300
Rlimit2 8 4 300
*Vbias_pullup 9 0 .13
*Vbias_pulldown 10 0 .16
Rbias_pullup_top 4 9 10K
Rbias_pullup_bottom 9 0 267
Rbias_pulldown_top 4 10 10K
Rbias_pulldown_bottom 10 0 330.5
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e−15
+ cgdo=3e−15 cgbo=5e−15 CJ=927u MJ=366m )
.MODEL fatty nmos(LEVEL=3 Vto=.9 kp=350u gamma=.2 phi=.6 lambda=.005
cgso=3.e−15
+ cgdo=3e−15 cgbo=5e−15 CJ=927u MJ=366m )
.MODEL shunt nmos(LEVEL=3 Vto=.3 kp=1u gamma=.2 phi=.6 lambda=.005
cgso=3.e−15
+ cgdo=3e−15 cgbo=5e−15 CJ=927u MJ=366m )
.MODEL shunt_dep nmos(LEVEL=3 Vto=0 kp=1u gamma=.2 phi=.6 lambda=.005
cgso=3.e−15
+ cgdo=3e−15 cgbo=5e−15 CJ=927u MJ=366m )
.NODESET V(6)=.3083 V(7)=5 V(8)=5
.ends cell_8_1
.subckt cell_8_2 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .15
*Vbias_pulldown 10 0 .165
Rbias_pullup_top 4 9 10K
Rbias_pullup_bottom 9 0 390
Rbias_pulldown_top 4 10 10K
Rbias_pulldown_bottom 10 0 418
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e−15
+ cgdo=3e−15 cgbo=5e−15 CJ=927u MJ=366m )
.MODEL fatty nmos(LEVEL=3 Vto=.9 kp=350u gamma=.2 phi=.6 lambda=.005
cgso=3.e−15
+ cgdo=3e−15 cgbo=5e−15 CJ=927u MJ=366m )
.MODEL shunt nmos(LEVEL=3 Vto=.3 kp=1u gamma=.2 phi=.6 lambda=.005
cgso=3.e−15
+ cgdo=3e−15 cgbo=5e−15 CJ=927u MJ=366m )
.MODEL shunt_dep nmos(LEVEL=3 Vto=0 kp=1u gamma=.2 phi=.6 lambda=.005
cgso=3.e−15
+ cgdo=3e−15 cgbo=5e−15 CJ=927u MJ=366m )
.NODESET V(6)=.3083 V(7)=5 V(8)=5
.ends cell_8_2
.subckt cell_8_3 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0.115
*Vbias_pulldown 10 0 0.115
Rbias_pullup_top 4 9 10K
Rbias_pullup_bottom 9 0 350
Rbias_pulldown_top 4 10 10K
Rbias_pulldown_bottom 10 0 378
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e−15
+ cgdo=3e−15 cgbo=5e−15 CJ=927u MJ=366m )
.MODEL fatty nmos(LEVEL=3 Vto=.9 kp=350u gamma=.2 phi=.6 lambda=.005
cgso=3.e−15
```

APPENDIX 1-continued

```
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell__8__3
.subckt cell__8__4 1 2 3 4
Mdrop 8 1 2 2 nmos L=2.5u W=10u
Mshunt 1 1 2 0 shunt L=2.5u W=2.5u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias__pullup 9 0 0.185
*Vbias__pulldown 10 0 0.16
Rbias__pullup__top 4 9 10K
Rbias__pullup__bottom 9 0 535
Rbias__pulldown__top 4 10 10K
Rbias__pulldown__bottom 10 0 535
*Rstart__1 2 0 10Meg
*Rstart__2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell__8__4
****4 transition Cells Used****
.subckt cell__4__1 1 2 3 4
Mdrop 8 1 2 2 nmos L=2.5u W=10u
Mshunt 1 1 2 0 shunt L=2.5u W=2.50u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias__pullup 9 0 .22
*Vbias__pulldown 10 0 .24
Rbias__pullup__top 4 9 10K
Rbias__pullup__bottom 9 0 460.2
Rbias__pulldown__top 4 10 10K
Rbias__pulldown__bottom 10 0 504
*Rstart__1 2 0 10Meg
*Rstart__2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell__4__1
.subckt cell__4__2 1 2 3 4
Mdrop 8 1 2 2 nmos L=2.5u W=10u
Mshunt 1 1 2 0 shunt L=2.5u W=2.50u
Mbuff 7 1 5 5 nmos L=2.5u W=400u
Mraise 1 1 5 0 shunt_dep L=2.5u W=10u
```

APPENDIX 1-continued

```
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .24
*Vbias_pulldown 10 0 0.23
Rbias_pullup_top 4 9 10K
Rbias_pullup_bottom 9 0 540
Rbias_pulldown_top 4 10 10K
Rbias_pulldown_bottom 10 0 620
*Rstart_1 2 0 10Meg
*Rstart_2 5 0 10Meg
.MODEL nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_4_2
.subckt cell_2 1 2 3 4
Mdrop 8 1 2 2 nmos L=2.5u W=10u
Mshunt 1 1 2 0 shunt L=2.5u W=2.50u
Mbuff 7 1 5 5 nmos L=2.5u W=400u
Mraise 1 1 5 0 shunt_dep L=2.5u W=10u
Mpullup 5 5 6 9 nmos L=2.5u W=10u
Mpulldown 6 5 0 10 fatty L=2.5u W=400u
Mslosh 6 6 3 0 nmos L=2.5u W=400u
Rlimit1 7 4 300
Rlimit2 8 4 300
*Vbias_pullup 9 0 .24
*Vbias_pulldown 10 0 0.23
Rbias_pullup_top 4 9 10K
Rbias_pullup_bottom 9 0 540
Rbias_pulldown_top 4 10 16K
Rbias_pulldown_bottom 10 0 120
*Rstart_1 2 0 10Meg
*Rstart_2 5 0 10Meg
.Model nmos nmos(LEVEL=3 Vto=.3 kp=350u gamma=.2 phi=.6 lambda=.005
cgso=3.e-15
+ cgdo=3e-15 cgbo=5e-15 CJ=927u MJ=366m )
.MODEL fatty nmos(LEVEL=3 Vto=.9 kp=350u gamma=.2 phi=.6 lambda=.005
cgso=3.e-15
+ cgdo=3e-15 cgbo=5e-15 CJ=927u MJ=366m )
.MODEL shunt nmos(LEVEL=3 Vto=.3 kp=1u gamma=.2 phi=.6 lambda=.005
cgso=3.e-15
+ cgdo=3e-15 cgbo=5e-15 CJ=927u MJ=366m )
.MODEL shunt_dep nmos(LEVEL=3 Vto=0 kp=1u gamma=.2 phi=.6 lambda=.005
cgso=3.e-15
+ cgdo=3e-15 cgbo=5e-15 CJ=927u MJ=366m )
.NODESET V(6)=.3083 V(7)=5 V(8)=5
.ends cell_2
****************************************************************
*******************Macro Circuits*************************
****************************************************************
****MOS Comparator****
.subckt mos_comp 1 2 3 4
M1 6 1 8 8 depletion L=2.5u W=40u
M2 7 2 8 8 depletion L=2.5u W=40u
M3 6 6 44 pmos L=2.5u W=100u
M4 7 6 44 pmos L=2.5u W=100u
M5 10 7 0 0 nmos L=2.5u W=40u
M6 10 7 4 4 pmos L=2.5u W=100u
M7 8 9 0 0 nmos L=2.5u W=40u
M8 9 9 0 0 nmos L=2.5u W=40u
R1 9 4 2K
M9 3 10 0 0 nmos L=2.5u W=40u
M10 3 10 4 4 pmos L=2.5u W=100u
.MODEL nmos nmos(LEVEL=1 Vto=.3 kp=350u gamma=.1 phi=.6 lambda=.005
cgso=3.e-15 cgdo=3e-15 cgbo=5e-15)
MODEL pmos pmos(LEVEL=1 Vto=-.3 kp 150u gamma=.1 phi=.6 lambda=.005
cgso=3.e-15 cgdo=3e-15 cgbo=5e-15)
```

APPENDIX 1-continued

```
MODEL depletion nmos(LEVEL=1 Vto=-.3 kp=350u gamma=.1 phi=.6 lambda=.005
cgso=3.e-15 cgdo=3e-15 cgbo=5e-15)
.ends mos_comp
****Arbel 32 Cicuit****
.subckt arbel32 1 901 900
Xcell1 1 2 901 900 cell
Xcell2 2 3 901 900 cell
Xcell3 3 4 901 900 cell
Xcell4 4 5 901 900 cell
Xcell5 5 6 901 900 cell
Xcell6 6 7 901 900 cell
Xcell7 7 8 901 900 cell
Xcell8 8 9 901 900 cell
Xcell9 9 10 901 900 cell
Xcell10 10 11 901 900 cell
Xcell11 11 12 901 900 cell
Xcell12 12 13 901 900 cell
Xcell13 13 14 901 900 cell
Xcell14 14 15 901 900 cell
Xcell15 15 16 901 900 cell
Xcell16 16 0 901 900 cell
Rload 901 0 100K
.ends arbel32
****Arbel 16 Circuit****
.subckt arbel16 1 901 900
Xcell1 1 2 901 900 cell_16_1
Xcell2 2 3 901 900 cell_16_2
Xcell3 3 4 901 900 cell_16_3
Xcell4 4 5 901 900 cell_16_4
Xcell5 5 6 901 900 cell_16_5
Xcell6 6 7 901 900 cell_16_6
Xcell7 7 8 901 900 cell_16_7
Xcell8 8 0 901 900 cell_16_8
Rload 901 0 100K
.NODESET V(2)=.7115 V(3)=.7115 V(4)=.7115 V(5)=.7115 V(6)=.7115 V(7)=.7115
V(8)=.4086
.ends arbel16
****Arbel 8 Circuit****
.subckt arbel8 1 901 900
Xcell1 1 2 901 900 cell_8_1
Xcell2 2 3 901 900 cell_8_2
Xcell3 3 4 901 900 cell_8_3
Xcell4 4 0 901 900 cell_8_4
Rload 901 0 100K
.NODESET V(2)=.7115 V(3)=.7115 V(4)=.4086
.ends arbel8
****Arbel 4 Ciruit****
.subckt arbel4 1 901 900
Xcell1 1 2 901 900 cell_4_1
Xcell2 2 0 901 900 cell_4_2
Rload 901 0 100K
.NODESET V(2)=.3
.ends arbel4
****Arbel 2 Ciruit****
.subckt arbel2 1 901 900
Xcell1 1 0 901 900 cell_2
Rload 901 0 100K
.ends arbel2
*************************************************************
********************Top Level Circuits*********************
*************************************************************
****R Bias Network****
Rbias_top_1 1 100 100
Rbias_bottom_1 100 0 10K
Rbias_top_2 1 101 10K
Rbias_bottom_2 101 0 9.75K
Rbias_top_4 1 102 30K
Rbias_bottom_4 102 0 10K
Rbias_top_8 1 103 70K
Rbias_bottom_8 103 0 10K
****DC Offset****
Voffset_dc_1 100 300 -.0002
Voffset_dc_2 101 301 -.5375
Voffset_dc_4 102 302 -.7997
Voffset_dc_8 103 303 -.959
****Channel****
Xchannel_1 300 400 800 arbel16
Xchannel_2 301 401 800 arbel8
Xchannel_4 302 402 800 arbel4
```

APPENDIX 1-continued

```
Xchannel_8 303 403 800 arbel2
****Comparator****
Xcomparator_1 400 500 600 800 mos_comp
Xcomparator_2 401 501 601 800 mos_comp
Xcomparator_4 402 502 602 800 mos_comp
Xcomparator_8 403 503 603 800 mos_comp
*Xcomparator_8 503 1 603 800 mos_comp
****Reference Generator****
Ref_top_1 800 500 10K
Ref_bottom_1 500 0 183
Ref_top_2 800 501 10K
Ref_bottom_2 501 0 187
Ref_top_4 800 502 10K
Ref_bottom_4 502 0 187
Ref_top_8 800 503 10K
Ref_bottom_8 503 0 222
*Vref_8 503 0 2.2
**********************************************************
****Power Supplies****
Vdd 800 0 DC 5
****Input Signal****
VSW 1 0 PULSE(1.15 3.6V 2ns .1n .1n 10ns 20ns)
****Tests****
.OP
*.TRAN 1ns 20ns 0ns 1ns
.PROBE
.DC VSW 0 5 .0001
.END
```

What is claimed is:

1. An N-bit analog-to-digital converter comprising:
at least one branch, each branch having:
a resistor-divider network including a plurality of resistors;
a first circuit configured to generate a voltage sawtooth signal as an output;
a DC offset circuit disposed to couple a node of the resistor-divider network and the first circuit;
a voltage reference circuit configured to generate a reference voltage; and
a differential comparator configured to compare the voltage sawtooth signal with the reference voltage to produce a digital output signal corresponding to the voltage sawtooth signal,
the first circuit including $2^{N-n}$ cells for each bit of the first circuit, wherein n is the current bit.

2. The analog-to-digital converter of claim 1, wherein the cells are coupled to a load resistor, the load resistor being tied to the differential comparator.

3. The analog-to-digital converter of claim 2, wherein each of the cells comprise at least first, second, and third sections, the first section being configured to generate a voltage drop, the second section being configured as a buffer section, and the third section being configured to generate a voltage sawtooth signal.

4. The analog-to-digital converter of claim 3, wherein the third section is designed using an all CMOS process.

5. The analog-to-digital converter of claim 2, wherein the differential comparator is designed for a single rail power supply.

6. The analog-to-digital converter of claim 1, wherein the differential comparator comprises a non-inverting input configured to receive the sawtooth signal, and an inverting input coupled to the voltage reference circuit.

7. The analog-to-digital converter of claim 1, wherein N-bit conversion of an analog signal to a digital signal is performed using N differential comparators.

8. The analog-to-digital converter of claim 1, wherein multiple cycles of voltage sawtooth signals are generated from a single ramp.

9. The analog-to-digital converter of claim 1, wherein the analog-to-digital converter comprises a self-encoding design using reduced number of differential comparators.

10. The analog-to-digital converter of claim 1, wherein a total number of branches equals N, and the number of cells in each branch's first circuit equals $2^{N-n}$.

11. An apparatus for converting an analog signal to a digital signal, comprising:
a resistor-divider network;
a first circuit configured to generate a voltage sawtooth signal as an output, the first circuit including $2^{N-n}$ cells for each bit of the first circuit, wherein N is the total number of bits and n is the current bit;
a DC offset circuit disposed to couple a node of the resistor-divider network and the first circuit;
a voltage reference circuit configured to generate a reference voltage; and
a differential comparator configured to compare the voltage sawtooth signal with the reference voltage to produce a digital output signal corresponding to the voltage sawtooth signal.

12. The apparatus of claim 11, wherein each of the cells includes a first section configured to generate a voltage drop, a second section configured as a buffer section, and a third section configured to generate the voltage sawtooth signal.

13. The apparatus of claim 12, wherein the third section comprises at least first, second, and third transistors, the first transistor being configured as a pull-up transistor, the second transistor being configured as a pull-down transistor.

14. The apparatus of claim 13, wherein a source contact of the pull-up transistor is connected to a drain contact of the pull-down transistor as well as a drain contact of the third transistor, the third transistor being configured to isolate the functionality of the cell.

15. The apparatus of claim 12, wherein the third section is designed using an all CMOS process.

16. The apparatus of claim 12, wherein the second section comprises at least a resistor and transistors configured as a common drain amplifier, wherein at least of the transistors is configured as a depletion mode shunt transistor.

17. The apparatus of claim 11, wherein the cells are coupled to a load resistor, the load resistor being tied to the differential comparator.

18. The apparatus of claim 17, wherein the differential comparator is designed for a single rail power supply.

19. The apparatus of claim 11, wherein the differential comparator comprises a non-inverting input configured to receive the voltage sawtooth signal, and the inverting input is coupled to the voltage reference circuit.

20. The apparatus of claim 11, wherein N-bit conversion of an analog signal to a digital signal is performed using N differential comparators.

21. The apparatus of claim 11, wherein multiple cycles of voltage sawtooth signals are generated from a single ramp.

22. A method of converting an analog signal to a digital signal, comprising:
   generating a voltage sawtooth signal using a first circuit, the first circuit having a plurality of cells, each cell being coupled to a load resistor, the load resistor being tied to a differential comparator, each cell having at least first, second, and third sections, the first section being configured to generate a voltage drop, the second section being configured as a buffer section, and the third section being configured to generate a voltage sawtooth signal and having at least one pull-up transistor and one pull-down transistor;
   generating a reference voltage; and
   comparing the voltage sawtooth signal with the reference voltage to produce a digital output signal corresponding to the voltage sawtooth signal.

23. The method of claim 22, wherein the comparing is performed using a differential comparator.

24. The method of claim 22, wherein N-bit conversion of an analog signal to a digital signal is performed using N differential comparators.

25. The method of claim 22, wherein the circuit includes $2^{N-n}$ cells for each bit of the first circuit, wherein N is the total number of bits and n is the current bit.

26. An N-bit analog-to-digital converter, comprising:
   N branches, each branch configured to receive an input voltage and output a voltage sawtooth; and
   a voltage divider section connecting inputs of the N branches,
   each branch including at least one cell,
   each cell having a circuit configured to generate a voltage sawtooth based on the input voltage, the circuit having at least a first, a second, and a third transistor, the first transistor being configured as a pull-up transistor, and the second transistor being configured as a pull-down transistor.

27. The analog-to-digital converter of claim 26, wherein a source contact of the pull-up transistor is connected to a drain contact of the pull-down transistor and to a drain contact of the third transistor.

28. The analog-to-digital converter of claim 27, the third transistor being configured to isolate the functionality of the cell.

29. The analog-to-digital converter of claim 27, wherein each branch has a number of cells equal to $2^{N-n}$, wherein n is a number of a current bit.

* * * * *

UNITED STATES PATENT AND TRADEMARK OFFICE
CERTIFICATE OF CORRECTION

PATENT NO. : 7,158,067 B2  Page 1 of 1
APPLICATION NO. : 11/053756
DATED : January 2, 2007
INVENTOR(S) : Keir C. Lauritzen et al.

It is certified that error appears in the above-identified patent and that said Letters Patent is hereby corrected as shown below:

Title Page Item 75, Inventors:

Now Reads:  Keir C. Lauritzen, Odenton, MD (US);
Martin Peckerar, Silver Spring, MD (US);
F. Keith Perkins, Alexandria, VA (US);
Angela M. Hodge-Miller, White Plains, MD (US)

Should Read: **Keir C. Lauritzen, Odenton, MD (US);
Martin Peckerar, Silver Spring, MD (US);
F. Keith Perkins, Alexandria, VA (US);
Angela Marie Hodge, White Plains, MD (US)**

Signed and Sealed this

Sixth Day of February, 2007

JON W. DUDAS
*Director of the United States Patent and Trademark Office*

UNITED STATES PATENT AND TRADEMARK OFFICE
CERTIFICATE OF CORRECTION

PATENT NO.        : 7,158,067 B2
APPLICATION NO. : 11/053756
DATED             : January 2, 2007
INVENTOR(S)       : Martin C. Peckerar et al.

Page 1 of 1

It is certified that error appears in the above-identified patent and that said Letters Patent is hereby corrected as shown below:

On the Title page, item (75) now shows:

(75) Inventors:  Lauritzen, Keir C. (Odenton, MD),
                 Peckerar, Martin (Silver Spring, MD),
                 Perkins, F. Keith (Alexandria, VA),
                 Hodge-Miller, Angela (White Plains, MD)

item (75) should read:

(75) Inventors:  Lauritzen, Keir C. (Odenton, MD),
                 Peckerar, Martin (Silver Spring, MD),
                 Perkins, F. Keith (Alexandria, VA),
                 Hodge, Angela M. (White Plains, MD)

Signed and Sealed this

Sixth Day of March, 2007

JON W. DUDAS
*Director of the United States Patent and Trademark Office*